US012808917B2

(12) United States Patent
Dalebroux et al.

(10) Patent No.: US 12,808,917 B2
(45) Date of Patent: Nov. 24, 2026

(54) FLEXIBLE ARBITRARY WAVEFORM GENERATOR AND INTERNAL SIGNAL MONITOR

(71) Applicant: Tektronix, Inc., Beaverton, OR (US)

(72) Inventors: Donald J. Dalebroux, Vernonia, OR (US); Alexander Krauska, Beaverton, OR (US); Maria Agoston, Beaverton, OR (US); Alejandro C. Buritica, Georgetown, TX (US)

(73) Assignee: Tektronix, Inc., Beaverton, OR (US)

( * ) Notice: Subject to any disclaimer, the term of this patent is extended or adjusted under 35 U.S.C. 154(b) by 666 days.

(21) Appl. No.: 18/354,584

(22) Filed: Jul. 18, 2023

(65) Prior Publication Data

US 2024/0027507 A1 Jan. 25, 2024

Related U.S. Application Data

(60) Provisional application No. 63/442,415, filed on Jan. 31, 2023, provisional application No. 63/391,291, filed on Jul. 21, 2022.

(51) Int. Cl.
*G01R 31/00* (2006.01)
*G01R 13/00* (2006.01)

(52) U.S. Cl.
CPC ............. *G01R 31/00* (2013.01); *G01R 13/00* (2013.01)

(58) Field of Classification Search
CPC .... G01R 13/00; G01R 31/00; G01R 31/2841; G01R 31/31907; G01R 33/3607; G01R 27/28; H01Q 3/26; H01Q 3/267; H04B 1/71632; H04B 1/7174; H04B 1/7176
See application file for complete search history.

(56) References Cited

U.S. PATENT DOCUMENTS

| | | | | |
|---|---|---|---|---|
| 5,909,460 | A | 6/1999 | Dent | |
| 6,397,173 | B1 * | 5/2002 | Campbell | G01R 31/2841 703/2 |
| 7,058,136 | B1 | 6/2006 | Hellberg et al. | |
| 7,132,830 | B2 | 11/2006 | Habara et al. | |
| 7,428,258 | B2 | 9/2008 | Fullerton et al. | |
| 11,096,243 | B2 | 8/2021 | Dunn | |

(Continued)

*Primary Examiner* — Catherine T. Rastovski
*Assistant Examiner* — Brian Butler Geiss
(74) *Attorney, Agent, or Firm* — Miller Nash LLP; Andrew J. Harrington

(57) ABSTRACT

A test and measurement instrument has an arbitrary waveform generator having at least two waveform generators. Each waveform generator includes a signal generator to generate in-phase (I) and quadrature (Q) digital signals according to a selected signal type for a digital constituent output signal, a pulse envelope sequencer to modulate amplitude of the I and Q digital signals, and one or more multipliers to combine the I and Q digital signals with a carrier signal to produce the digital constituent output signal. The arbitrary waveform generator includes a stream manager to produce modulation descriptor words for the waveform generators, a summing block to selectively combine digital constituent output signals to produce a digital multi-constituent output signal, a digital-to-analog converter to convert the digital multi-constituent output signal to an analog output signal, and an internal signal analyzer to receive an analyzer input of one of more of the digital output signals.

13 Claims, 3 Drawing Sheets

(56) References Cited

U.S. PATENT DOCUMENTS

| | | | | |
|---|---|---|---|---|
| 2006/0271317 | A1 * | 11/2006 | Ammerman ....... | G01R 31/2841 702/66 |
| 2009/0086873 | A1 * | 4/2009 | Obata ................ | G01R 31/3171 375/371 |
| 2015/0256380 | A1 | 9/2015 | Jones et al. | |

* cited by examiner

FLEXIBLE ARBITRARY WAVEFORM GENERATOR AND INTERNAL SIGNAL MONITOR

CROSS-REFERENCE TO RELATED APPLICATIONS

This disclosure claims benefit of U.S. Provisional Application No. 63/391,291, titled "FLEXIBLE ARBITRARY WAVEFORM GENERATOR," filed on Jul. 21, 2022, and U.S. Provisional Application No. 63/442,415, titled "TEST AND MEASUREMENT INSTRUMENT HAVING INTERNAL SIGNAL MONITORING," filed on Jan. 31, 2023, the disclosures of both of which are incorporated herein by reference in their entirety.

TECHNICAL FIELD

This disclosure relates to test and measurement instruments, and more particularly to an arbitrary waveform generator, and a test and measurement instrument for creating and visualizing the waveforms generated.

BACKGROUND

With the increasing use of various signals for communications, location, and ranging, equipment must differentiate the signals intended for the equipment from all the other signals around it. For example, 5G signals used in cell phone towers may exist in an area in which the equipment operates to receive signals of a different type. Manufacturers and users need to test their equipment using mixes of different types of signals. A signal generator may be used to stress test a receiver system with multiple signals or test a component or device replicating real-world stresses a components may receive.

One type of instrument, an arbitrary waveform generator, generates a signal of a selected type. However, most of these do not generate signals that are mixes of other signals, they generate a single signal type at any given time. This works to test the equipment for a particular type of signal but does not allow the ability to test for that type of signal when it is part of a signal mixture that includes other types of signals.

Another aspect of this situation lies in the inability of users to determine the true characteristics of their signal as it is generated. Typically, users connect the AWG or other signal generator to a spectrum analyzer external to the signal generator. This introduces delays, and in some cases, does not allow the user to see their generated signal before undergoing digital-to-analog conversion or other operations on the signal. Being able to see the signal before it actually exits the generator has many advantages, such as being able to compare the resulting signal and the generated signal.

A common use of such an ideal internal signal is as a reference to algorithms that may be employed with a generator such as digital predistortion (DPD) and data driven error vector magnitude (EVM) measurements. The internal generator signal is used as a "reference" signal for the DPD algorithm which compares a distorted output of the generator to the reference signal and uses one of many techniques to construct "predistortion" to minimize output distortion. In EVM measurements the reference signal is used to guide scoring of error vector magnitude scoring by an external receiver.

Embodiments of the disclosure address these and other limitations of conventional instruments and generators.

DETAILED DESCRIPTION

Embodiments here involve an arbitrary waveform generator that can generate waveforms for mixtures of signals. In response to an input, a stream manager generates a modulation descriptor word (MDW) for each waveform generator involved. Each waveform generator generates a signal for its type of signaling, and then the instrument combines the signals into an output signal mixture.

Figure 1:
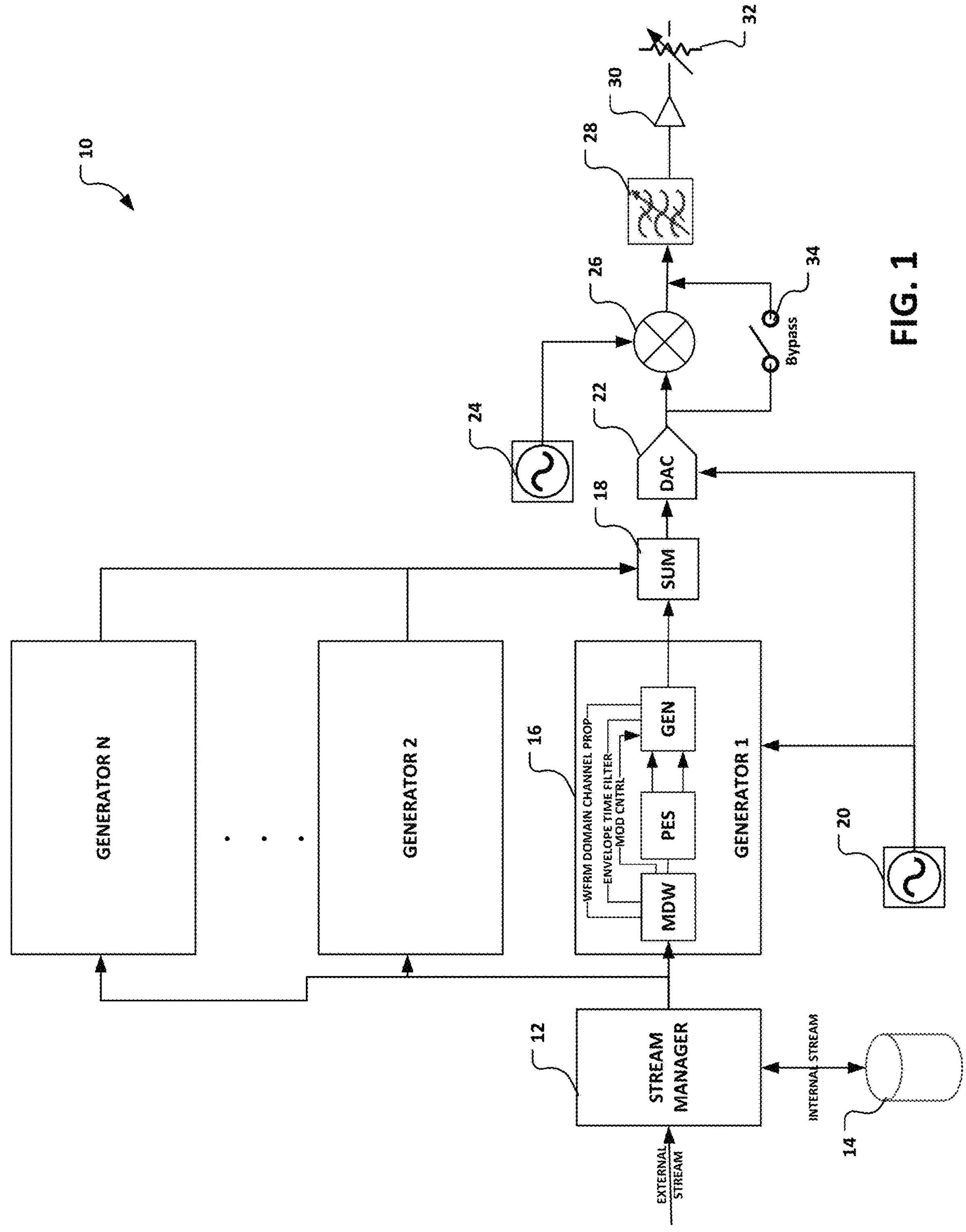
FIG. 1 shows a diagram of an embodiment of a flexible arbitrary waveform generator.

FIG. 1 shows a diagram of an embodiment of a test and measurement instrument such as an arbitrary waveform generator (AWG) or other instrument configured to generate signal mixtures. As used herein, the resulting digital output signal will be referred to as a "complex signal," meaning the resulting signal is a mixture of other types of generated signals. The generators may generate one of most known radio frequency (RF) signal types, including, but not limited to, orthogonal frequency-division multiplexing (OFDM), single carrier complex modulation, M-ary quadrature amplitude modulation (QAM), M-ary pulse amplitude modulation (M-PAM), and M-ary phase shift keying (M-PSK). The signal generators may also create multiple signals both digitally, but also arbitrary non-orthogonal signal carriers. Some number of generators would each generate a selected signal and the AWG would combine the selected signals into a complex signal. To maintain the flexibility of the AWG, only one selected signal may exist in the complex signal, allowing the requesting system or user to employ the AWG as a single AWG or a combined one.

FIG. 1 shows an overall architecture for a flexible AWG 10 in accordance with the embodiments. The AWG 10 has multiple waveform generators such as 16. A stream manager 12 receives an external stream or request that includes a list of the modulation types and parameters for a group of signals for the AWG to combine into a complex signal. With the understanding that the request may only include a single signal, this discussion will address the function when the request includes two or more signals to combine into one complex signal.

The external stream input may result from a user entering the modulation types and parameters for each signal, a series of programmatic interface (PI) commands, or a record-based type of structure, such as a TCP/IP frame, or an API (Application Programming Interface) among many others, including any storage or communications media described below. The stream manager 12 takes the input and sends one signal to each signal generator, such as 16. The stream manager 12 may access an internal stream from a storage 14 that provides data to allow the stream manager to provide data to the generators. The AWG may include 1-N signal generators. The AWG comprises one type of test and measurement instrument used to test devices or systems under test (DUTs) in environments with multiple signal types operating simultaneously in a given environment.

Each generator has a similar or the same architecture as generator 16. In one embodiment these generators comprise sections of a field-programmable gate array (FPGA), or may comprise a portion of a general-purpose processor, digital signal processor, graphics processing unit, remote processor resource, web computing resource etc. This discussion will refer to these herein as "processors." The processors may be configured to execute code that causes the processors to perform the tasks of the embodiments.

The stream manager 12 receives the input and then sends a modulation descriptor word (MDW) to however many generators are needed to create the complex signal. The signal generator controls the envelope, or overall shape of the signal to be generated. The "envelope" of a signal refers to the boundary that contains the signal, or in other words, the outline of the extremes of the signal. The MDW provides the envelope information, as well as the characteristics of the modulation, such as a modulated carrier wave, an RF carrier, baseband carrier, etc. The MDW defines a kernel of the parameters used by the I/Q (in-phase/quadrature) core to express the signals.

The system creates complex envelope shapes. The envelope shapes may be used by the generators to represent many forms of amplitude envelope modulation, such as rise/fall/settling time, rectangular, trapezoidal, raised cosine, square root-raised cosine, Gaussian, exponential, and others. When applied to RF signals, many forms of RF signals amplitude modulation may include the RF pulse rise/fall time, sweeping antenna parameters, varying pulse duty cycles, and pulse repetition frequencies (PRF). The PRFs may themselves be modulated by static, linear, non-linear, exponential, jittered, or other arbitrary patterns. The term "pulsed signals" as used here includes a subset of non-pulsed, continuous signals. The pulsed or continuous signals may comprise modulated, unmodulated, filtered, unfiltered, distorted, or undistorted signals, using any of the above techniques.

The embodiments here describe a more complete, more general form of RF signal formation from any or all of IQ signal burst, data based digital modulation such as 5G per 3GPP standards, Wi-fi per IEEE standards, Generic Digital QAM (to be specified below), FM and FSK, AM and ASK, and PM and PSK, which have tended to be used for signal communication with secondary use as sensing waveforms. The signal formation may also include continuous wave (CW), Multi-tone CW, and other signals for use as pilot tones. Additionally, the signals may include Signal sensing waveforms, which may be secondarily use for sensing, CW chirps of various profiles, up, down, up-down linear, and nonlinear sweeps, pulsed envelopes of rectangular, trapezoidal, exponential, Gaussian, windows, filters of various types, modulation of linear up/down, up/down chirp, FM-FSK, Linear FM, Nonlinear FM, Nonlinear PM, Barker Codes, Stepped FM, modulation of pulse parameters to simulate edge jitter, impulse settling defects, pulse width modulation, and pulse repetition rate modulation of various types. Finally, the ability to construct by a framework, various innovative established standard and pre-standard waveforms for various sensing, communication, or other purposes. The most general concept is that all signals are pulsed signals. CW signals can be seen as a pulsed signal with infinite pulse width.

The digital constituent output signals from each generator involved in the creation of the complex signal are then selectively summed at 18 to create a digital complex output signal. A digital-to-analog converter (DAC) then converts the digital complex output signal to an analog signal. The analog signal may undergo frequency conversion at multiplier 26 using a local oscillator 24, although a bypass path consisting of a bypass switch 34 may allow the signal to not undergo frequency conversion. Another option to avoid frequency conversion would involve having the multiplier 26 have an argument of 1.

The resulting signal may undergo variable bandpass filtering using variable bandpass filter 28, amplification or buffering at 30, and having variable resistance applied at 32 to control the signal power. The filtering of the resulting complex signal may have several uses. In one embodiment, the filtering may allow for protocol conformance, to accommodate channel or other distortions, or non-linear distortions. The filter frequency response, time and phase response, or non-linear amplitude response may allow the system to create models of distortion customers may want their signal source to replicate as a desired signal. The filtering may also pre-compensate or pre-distort the signals to allow the signal generator to connect to non-ideal external devices, compensating for the defects of the external accessories, such as amplifiers, mixers, filters, and transmission lines. As will be discussed in more detail with regard to FIG. 2, filters may be applied to the complex signal and/or to the constituent signals in the signal generators.

Figure 2:
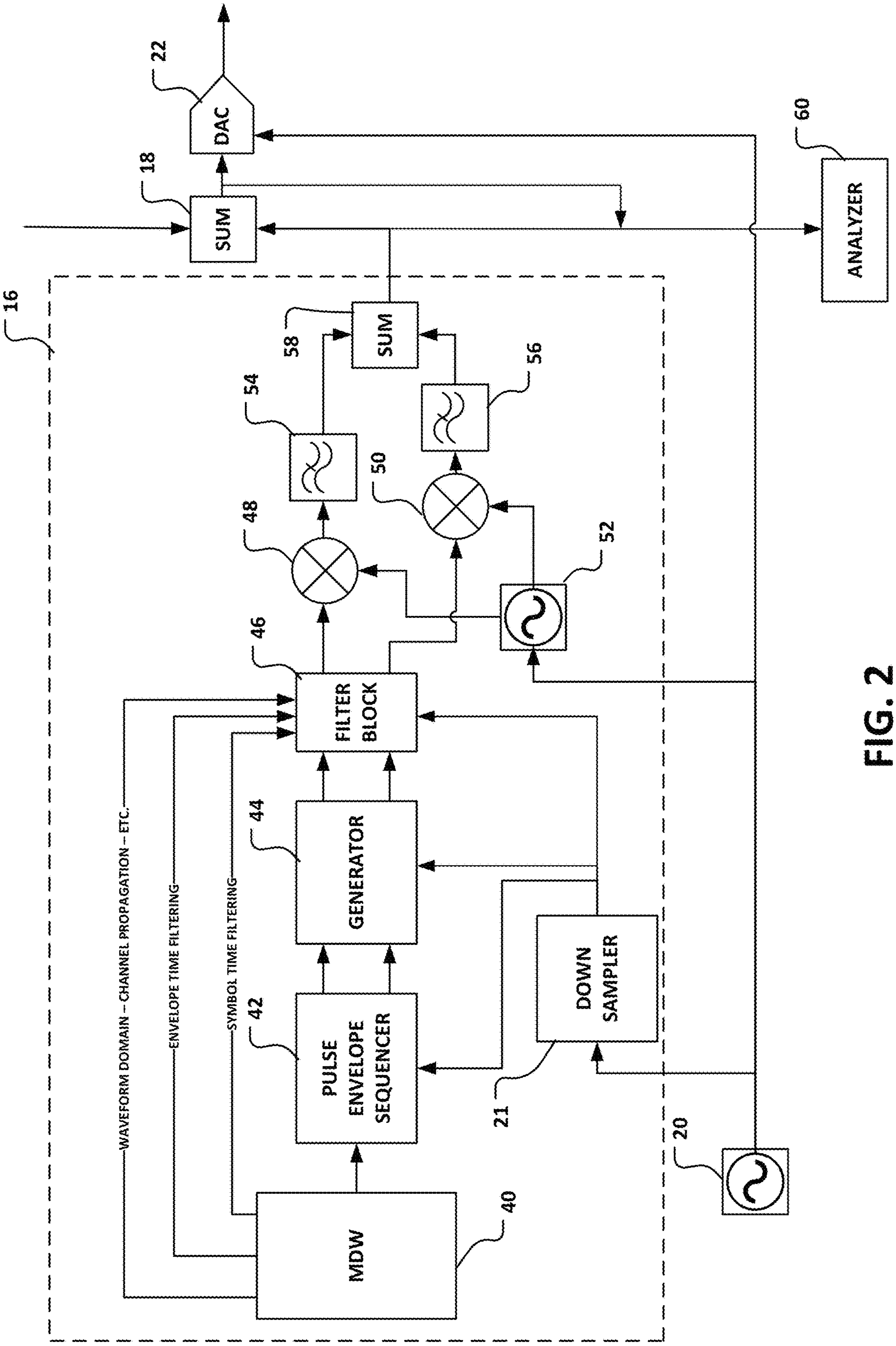
FIG. 2 shows a diagram of an embodiment of a channel of a flexible arbitrary waveform generator.

Turning now to the architecture of an individual generator, FIG. 2 shows an embodiment of such a generator 16. One should note that this comprises an example of such a generator and is not intended to limit the architecture of the generator. Generator 16 includes the MDW receiver that receives the MDW for the generator received from the stream manager 12 in the overall system shown in FIG. 1. The MDW module receives the MDW word that sets out the kernel of parameters and provides various parameters to the filter block 46. The pulse envelope sequencer (PES) uses the MDW word and provides the baseband generator 44 with the chirp, or sweep signal, and the type of signal. The baseband generator generates the in-phase (I) and quadrature (Q) signals according to the selected type of signal the generator 44 creates as the digital constituent output signal to be added to the digital complex output signal. The generator 44 then provides the IQ signals to the filter block 46.

The signal may be expressed as:

$$s(t)=(A_0(t)+A_1)*\cos(2\pi f_{o1}+\mathrm{fm}_1(t))t+\theta_i(t)+\theta_2)+(B_2(t)+B_3)*\sin(2\pi f_{o2}+\mathrm{fm}_2(t))t+\theta_3(t)+\theta_4)$$

as one way to express the general amplitude modulation by A(t) and B(t) and frequency modulation fm(t) and phase modulation θ(t).

The DC offset terms in amplitude, $A_1$, $B_3$, frequency offset terms $f_{o1}$, $f_{o2}$ and phase offset terms $\theta_2$, $\theta_4$ have no variation in time. These terms are used in system operation to create desired system across channels of offsets across channels, to correct for channel defects, such as amplifier distortion and offset, mixer distortion and offset, IQ distortion and offset.

For efficient and flexible implementation, the amplitude offset terms may be routed around the DAC to hardware downstream of an RF amplifier. This may be called composite operation whereby an AC signal passes through the DAC, and a downstream RF amplifier and RF mixers, followed by a DC summing junction which allows the DC portion to be added.

$A(t)=(A_0(t)+A_2)$ and $B(t)=(B_3\ (t)+B_4)$ being different magnitudes allows for flexibility in addressing the required symbol formations required for the modulation, as well as for correction by predistortion.

Frequency and phase terms, ($\theta(t)$: $\theta_4$, $\theta_2$, $\theta_3$, $\theta_4$) are related mathematically:

$$\frac{\partial\theta}{\partial t} = f(t);$$

meaning that efficient implementation could express the complete relationship as a phase equation or only a frequency equation however they are expressed separately to allow flexibility in the implementation of the generator as either a phase vector θ(n) over time or a frequency vector fm(n) over time, or both frequency and phase where n represents the nth sample of the evolving vectors.

Using a vector x(n) means any sequence of discrete samples, whether they are stored in memory, or cached dynamically in a FIFO, or evolved generatively. In a generative sense perhaps only the current sample is available.

The filter block 46 receives information from the MDW module such as the waveform domain, channel propagation, etc., the envelope time filtering, and the symbol time filtering such as root-raised cosine (RRC) filtering. The filter block 46 then applies the desired filtering.

Clock 20 undergoes down sampling at 21, both integer and fractional, to provide individual synchronous clocking to the pulse envelope sequencer, the baseband generator, and the filter block. The outputs of the filter block are the I and Q signals for the constituent signal. The multipliers 48 and 50, and the numerically controlled oscillator (NCO) 52 take the I and Q signal words and multiply them in the sine and cosine outputs of the NCO to create a digital upconverted signal at the sum output 58 at the carrier frequency words determined by the MDW. The filter block 46 may include digital up conversion to match a potentially lower rate digital signal with the sample rate of the multiplier and NCO output. The customer/user provides the carrier frequency. The low pass filters 54 and 56 may have the same width and shape. For example, if filters 54 and 56 are 100 MHz low pass filters, they will allow a 200 MHz passband centered at the frequency given by NCO 52. The multiplication of the baseband signal originating in 46, by multipliers 48 and 50, will produce harmonics and images around n*FNCO. The lowpass filters select the first Nyquist image. Bandpass filters may select higher Nyquist images.

The signal generators such as 16 may include filters, such as the filter block 46, and may possess the capabilities to perform operations on the signals as needed or desired. For example, the signal generators can add noise to the signal, both as a means to dither the signal to expand the spurious-free dynamic range (SFDR) of the signal, and as an intentional artifact the customer wants to be added to the signal. The noise may be shaped by time length, frequency shape, and amplitude distribution. The digital signal processing may allow the system to represent environment or channel distortions such as backplane loss, delay, or dispersion, cable, waveguide, or fiber losses or dispersions, or the effects of external accessories, mentioned above.

After generation of the constituent signal and summing with the other signal(s) at 18 to form the complex signal, the signal undergoes conversion by the DAC 22. The carrier signal, either baseband or RF, shall be applied to the DAC and clocked at the full sample rate of the DAC, such as 25 or 50 Gigasamples/s (Gs/s). The output of the DAC may be routed directly or through an RF converter.

Regarding the time synchronization and considerations, the generator will maintain a time record to allow each signal kernel time, RF pulse, baseband pulse, CW signal moment, to be known. This allows the time of each pulse to be known in a precision counter, such as a 64-bit counter of cycles of a high rate clock such as clock 20. This means that the latency to produce a signal with certain MDW parameters from the pulse envelope created through the DAC and upconverter is known. It is expected that different forms of signal will have different latency, but with each being known, the preparatory computations will occur in advance of their Delivery to the DAC and to the output of the generator product. This allows scheduling of the signal kernel against a time-correlated master clock, resulting in the signal kernel with its modulation occurring at the connector output at a known time. The internal filtering block and time alignment circuit permits modulation of any particular signal to an arbitrary time/phase offset. An example of digital time alignment is in the polyphaser rotational shift method, acting as a conveyor belt to advance or retard latency. In one embodiment, a certain amount of static latency may be added to each channel so that channels of differing latency come into alignment, based upon the known timing discussed above. A user may specify how the time is to align, by a default instrument, a post-aligned instrument, or other user specification. The user may also have the capability to specify an offset on top of the alignment offsets used to align the outputs.

Returning to the output circuitry shown in FIG. 1, the frequency converter may employ a low phase noise local oscillator 24 of moderate switching speed, or a lower phase noise and faster switching time. The FPGA or other processor that operates one of the signal generators, typically the first one, controls the rates of frequency of switching. This allows multiple products of various performance levels to meet application specific requirements with programmable capabilities.

Returning to FIG. 2, one can see an internal analyzer 60. The internal analyzer 60 allows the user to see the generated complex signal, or one or more of the constituent signals, or even one or more of the I Q signals of the constituent signal, the connection to which is not shown here for simplicity, in digital form before the DAC. The test and measurement instrument tests and analyzes signals generated or sourced by the measurement instrument itself, such as the flexible Arbitrary Waveform Generator above. Embodiments give users of signal-generating instruments the ability to see time and spectrum content of test signals that were generated internally by the signal source instrument. Spectrum content may be shown to the users, for example, on devices employing Signal Vu spectrum visualization, available from Tektronix, Inc., of Beaverton, Oregon.

Additional views showing pulse analysis as time-correlated measurements of the generated test signals may also be displayed to the user. For example, users can view a time and frequency analysis of the generated test signals either before or as the test signals are being generated. Plus, such an instrument including internal signal monitoring helps users corroborate that the test signal has the correct properties and characteristics that they intend to generate into their DUTs, without the need to connect to any external instruments. This ability to monitor and/or visualize internally generated signals minimizes the uncertainty of test scenarios and instills confidence in users that they will be driving their DUTs or controlled sub-systems with correct stimulus signals.

Figure 3:
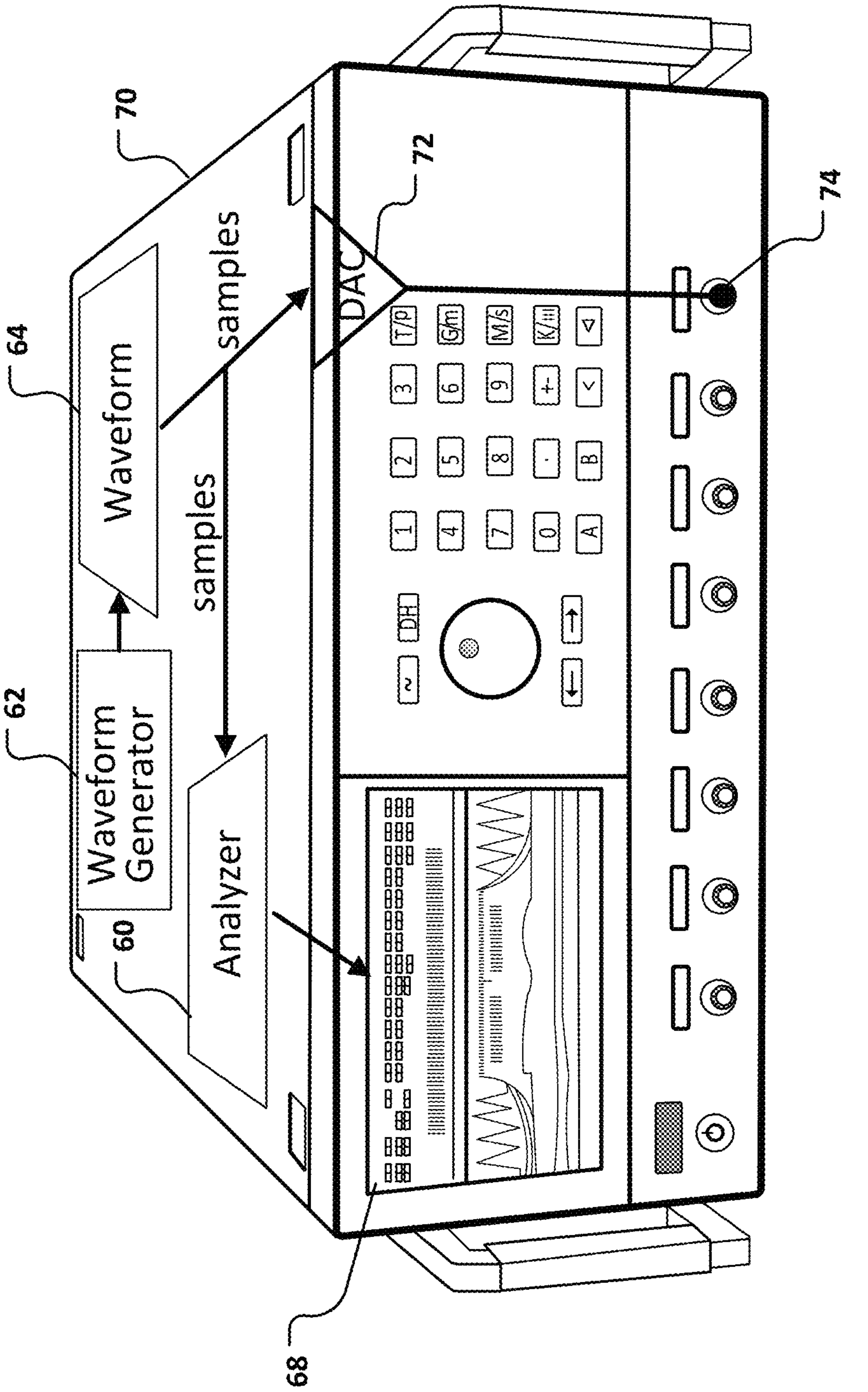
FIG. 3 shows a test and measurement device including internal signal monitoring.

FIG. 3 shows an embodiment of a test and measurement instrument 70, such as an AWG, including internal signal monitoring. Instrument 70 includes a waveform generator 62, which is structured to generate any type of waveform, and may take the form of the flexible AWG discussed above. Typically, these waveforms are applied to an external DUT for testing the DUT with known signals. The generated waveform 64 is referred to as waveform 64 in FIG. 3. Then, the generated waveform 64 represented by samples, is sent to different types of waveform analyzers, such as an analyzer 60, which may perform IQ analysis. The samples being analyzed may be selected from the samples of the entire waveform, essentially sampling the samples. The samples could also undergo resampling to reduce the data rate. The generated waveform samples 64 may also be sent to a Digital to Analog Converter (DAC) 72 to convert the generated waveform samples 64 into an analog signal. The analyzer 60 then can perform spectrum and time analysis on the generated waveform samples 64. In one embodiment, the analysis may also be applied to the analog version of the generated waveform generated by the DAC 72.

This analysis and display feature described above incorporates spectrum measurement capabilities into the signal sources to analyze the samples that the signal source will play (or is currently generating) and give users numerically accurate results. The results may be displayed to the user on display 68. This way, customers know how much bandwidth their various signals occupy, how much power they generate, how fast they rise and fall, as well as the exact frequency location of environment scenarios with multiple waveforms playing simultaneously. Because there are multiple sample rates, it can be confusing as to the exact frequency location of a signal. Analyzing the signal with the known rate in each data path allows unambiguous accurate display. For example in the current AWG product, one intends to create a 5 GHz signal, with 250 Mhz bandwidth, at 25 GS/s clock rate. However, if one does not realize the clock rate was set to 20 Gz, the actual signal is generated at 4 GHz instead.

One advantage of an instrument including a system for internal monitoring and measurement of system-generated or initiated signals is that the spectrum analyzer of the instrument can be pre-configured based on the generated signal attributes. Further, the ability to perform truly representative and accurate measurements on the samples that the signal source generates eliminates the need for a preliminary measurement step using external analyzers.

The inclusion of an internal analysis module, such as a spectrum analyzer, would generally take the form of the test and measurement instrument processor or processors executing code that would cause the processor(s) to perform the analysis. The processor then would display the results of the analysis to the users. Unlike the estimation of the signals mentioned above, the analysis results in numerically accurate measurement.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 is a test and measurement instrument, comprising: a flexible arbitrary waveform generator, comprising: at least two waveform generators, each waveform generator comprising: a signal generator to generate in-phase and quadrature digital signals according to a selected signal type for a digital constituent output signal to be generated by the signal generator; a pulse envelope sequencer to modulate amplitude of the in-phase and quadrature digital signals for the digital constituent output signal; and one or more multipliers to combine the in-phase and quadrature digital signals with a carrier signal to produce the digital constituent output signal; a stream manager to receive an input and produce a modulation descriptor word (MDW) for any of the at least two waveform generators to be used to produce the digital constituent output signal; a summing block to selectively combine digital constituent output signals from any of the at least two waveform generators to produce a digital multi-constituent output signal; a digital-to-analog converter (DAC) to convert the digital multi-constituent output signal to an analog output signal; and an internal signal analyzer configured to receive an analyzer input of one of more of the digital output signals.

Example 2 is the test and measurement instrument of Example 1, wherein the digital multi-constituent output signal comprises one of either a single digital constituent output signal, or a mixture of two or more digital constituent output signals.

Example 3 is the test and measurement instrument of either of Examples 1 or 2, wherein the internal analyzer receives one or more digital constituent output signals prior to the summing block to analyze the one or more digital constituent output signals.

Example 4 is the test and measurement instrument of any of Examples 1 through 3, wherein the internal analyzer is configured to receive the digital multi-constituent output signal prior to the DAC.

Example 5 is the test and measurement instrument of any of Examples 1 through 4, further comprising a filter connected to the DAC to allow filtering of the analog output signal.

Example 6 is the test and measurement instrument of any of Examples 1 through 5, further comprising a multiplier applied to the analog output signal, wherein the multiplier is configurable to have an argument of 1, or to have a switch to allow bypass of the multiplier.

Example 7 is an arbitrary function generator, comprising: at least two waveform generators, each waveform generator comprising: a digital signal generator to generate in-phase and quadrature digital signals according to a selected signal type for a digital constituent output signal to be generated by the digital signal generator; a digital pulse envelope sequencer to modulate amplitude of the in-phase and quadrature digital signals for the digital constituent output signal; and a digital filter for applying at least one digital filter to the in-phase and quadrature signals; and a digital signal modulator configured to combine the in-phase and quadrature digital signals with a carrier signal to produce the digital constituent output signal; a stream manager to receive an input and produce a modulation descriptor word (MDW) containing a kernel of parameters for any of the at least two waveform generators to be used to produce the digital constituent output signal; a summing block to combine digital constituent output signals from any of the at least two waveform generators to produce a digital multi-constituent output signal; and a digital-to-analog converter (DAC) to convert the digital multi-constituent output signal to an analog output signal.

Example 8 is the arbitrary waveform generator of Example 7, wherein the selected signal type for each waveform generator is one of Orthogonal Frequency Division Multiplexed (OFDM), single-carrier complex modulation, M-ary Quadrature Amplitude Modulation (M-QAM), M-ary Pulse Amplitude Modulation (M-PAM), and M-ary Phase Shift Keying (M-PSK).

Example 9 is the arbitrary waveform generator of either of Examples 7 or 8, wherein the MDW describes characteristics of the signal being one of continuous wave modulated, radio frequency (RF) carrier, and baseband carrier.

Example 10 is the arbitrary waveform generator of Any of Examples 7 through X, further comprising a filter applied to the analog output signal.

Example 11 is the arbitrary waveform generator of any of Examples 7 through 10, wherein the digital filter is configured to perform at least one of: creating distortion models to replicate a desired signal; and one of either pre-compensating or pre-distorting the digital multi-constituent output signal to account for non-ideal external devices.

Example 12 is the arbitrary waveform generator of any of Examples 7 through 11, wherein the digital signal generator is configured to add noise to the in-phase and quadrature signals.

Example 13 is the arbitrary waveform generator of any of Examples 7 through 12, further comprising a local oscillator connected to the analog output signal as a frequency converter under control of one of the signal generators.

Example 14 is the arbitrary waveform generator of any of Examples 7 through 13, wherein each waveform generator is configured to: maintain a time record of each kernel time; determine a latency to produce a signal for each kernel; and schedule the signal kernel against a time-correlated master clock to produce the digital constituent output signal at a known time.

Example 15 is a test and measurement instrument, comprising: a waveform generator structured to generate a digital waveform having samples; a digital-to-analog converter (DAC) to convert the samples of the digital waveform to an analog waveform; and one or more processors configured to execute code to cause the one or more processors to analyze the samples prior to the DAC, the one or more analyzes configured to perform a signal analysis on the waveform without having to connect any external instruments.

Example 16 is the test and measurement instrument of Example 15, wherein the code to cause the one or more processors to analyze the samples comprises code to cause the one or more processors to perform in-phase and quadrature (IQ) analysis of the samples.

Example 17 is the test and measurement instrument of either of Examples 15 or 16, wherein the code to cause the one or more processors to analyze the samples comprises code to cause the one or more processors to determine one or more of how much power the waveform generates, bandwidth used by the waveform, how fast the waveform rises and falls.

Example 18 is the test and measurement instrument of any of Examples 15 through 17, wherein the code to cause the one or more processors to analyze the samples comprises code to cause the one or more processors to perform time and spectrum analysis on the waveform.

Example 19 is the test and measurement instrument of Example 18, wherein the code to cause the one or more processors to perform time and spectrum analysis on the samples comprises code to cause the one or more processors to display characteristics of the signal to users, including modulation, pulse analysis and time-correlated measurements.

Example 20 is the test and measurement instrument any of Examples 15 through 19, wherein the code to cause the one or more processors to analyze the samples comprises code to cause the one or more processors to determine an exact frequency of scenarios when multiple waveforms are generated simultaneously.

The previously described versions of the disclosed subject matter have many advantages that were either described or would be apparent to a person of ordinary skill. Even so, these advantages or features are not required in all versions of the disclosed apparatus, systems, or methods.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

What is claimed is:

1. A test and measurement instrument, comprising:
- a flexible arbitrary waveform generator, comprising:
- at least two waveform generators, each waveform generator comprising:
  - a signal generator to generate in-phase and quadrature digital signals according to a selected signal type for a digital constituent output signal to be generated by the signal generator;
  - a pulse envelope sequencer to modulate amplitude of the in-phase and quadrature digital signals for the digital constituent output signal; and
  - one or more multipliers to combine the in-phase and quadrature digital signals with a carrier signal to produce the digital constituent output signal;
- a stream manager to receive an input and produce a modulation descriptor word (MDW) for any of the at least two waveform generators to be used to produce the digital constituent output signal;
- a summing block to selectively combine digital constituent output signals from any of the at least two waveform generators to produce a digital multi-constituent output signal;
- a digital-to-analog converter (DAC) to convert the digital multi-constituent output signal to an analog output signal; and
- an internal signal analyzer configured to receive an analyzer input of one or more of the digital output signals, wherein the internal analyzer receives one or more digital constituent output signals prior to the summing block to analyze the one or more digital constituent output signals.

2. The test and measurement instrument as claimed in claim 1, wherein the digital multi-constituent output signal comprises one of either a single digital constituent output signal, or a mixture of two or more digital constituent output signals.

3. The test and measurement instrument as claimed in claim 1, wherein the internal analyzer is configured to receive the digital multi-constituent output signal prior to the DAC.

4. The test and measurement instrument as claimed in claim 1, further comprising a filter connected to the DAC to allow filtering of the analog output signal.

5. The test and measurement instrument as claimed in claim 1, further comprising a multiplier applied to the analog output signal, wherein the multiplier is configurable to have an argument of 1, or to have a switch to allow bypass of the multiplier.

6. An arbitrary function generator, comprising:
- at least two waveform generators, each waveform generator comprising:
  - a digital signal generator to generate in-phase and quadrature digital signals according to a selected signal type for a digital constituent output signal to be generated by the digital signal generator;
  - a digital pulse envelope sequencer to modulate amplitude of the in-phase and quadrature digital signals for the digital constituent output signal; and
  - a digital filter for applying at least one digital filter to the in-phase and quadrature signals; and
  - a digital signal modulator configured to combine the in-phase and quadrature digital signals with a carrier signal to produce the digital constituent output signal;
- a stream manager to receive an input and produce a modulation descriptor word (MDW) containing a kernel of parameters for any of the at least two waveform generators to be used to produce the digital constituent output signal, wherein the MDW describes characteristics of the signal being one of continuous wave modulated, radio frequency (RF) carrier, and baseband carrier;
- a summing block to combine digital constituent output signals from any of the at least two waveform generators to produce a digital multi-constituent output signal; and
- a digital-to-analog converter (DAC) to convert the digital multi-constituent output signal to an analog output signal.

7. The arbitrary waveform generator as claimed in claim 6, wherein the selected signal type for each waveform generator is one of Orthogonal Frequency Division Multiplexed (OFDM), single-carrier complex modulation, M-ary Quadrature Amplitude Modulation (M-QAM), M-ary Pulse Amplitude Modulation (M-PAM), and M-ary Phase Shift Keying (M-PSK).

8. The arbitrary waveform generator as claimed in claim 6, further comprising a filter applied to the analog output signal.

9. The arbitrary waveform generator as claimed in claim 6, wherein the digital filter is configured to perform at least one of: creating distortion models to replicate a desired signal; and one of either pre-compensating or pre-distorting the digital multi-constituent output signal to account for non-ideal external devices.

10. The arbitrary waveform generator as claimed in claim 6, wherein the digital signal generator is configured to add noise to the in-phase and quadrature signals.

11. The arbitrary waveform generator as claimed in claim 6, further comprising a local oscillator connected to the analog output signal as a frequency converter under control of one of the signal generators.

12. The arbitrary waveform generator as claimed in claim 6, wherein each waveform generator is configured to:
- maintain a time record of each kernel time;
- determine a latency to produce a signal for each kernel; and
- schedule the signal kernel against a time-correlated master clock to produce the digital constituent output signal at a known time.

13. A test and measurement instrument, comprising:

a flexible arbitrary waveform generator, comprising:

at least two waveform generators, each waveform generator comprising:

a signal generator to generate in-phase and quadrature digital signals according to a selected signal type for a digital constituent output signal to be generated by the signal generator;

a pulse envelope sequencer to modulate amplitude of the in-phase and quadrature digital signals for the digital constituent output signal; and one or more multipliers to combine the in-phase and quadrature digital signals with a carrier signal to produce the digital constituent output signal;

a stream manager to receive an input and produce a modulation descriptor word (MDW) for any of the at least two waveform generators to be used to produce the digital constituent output signal;

a summing block to selectively combine digital constituent output signals from any of the at least two waveform generators to produce a digital multi-constituent output signal;

a digital-to-analog converter (DAC) to convert the digital multi-constituent output signal to an analog output signal;

an internal signal analyzer configured to receive an analyzer input of one or more of the digital output signals; and a multiplier applied to the analog output signal, wherein the multiplier is configurable to have an argument of 1, or to have a switch to allow bypass of the multiplier.

* * * * *